(12) United States Patent  
Ohno

(10) Patent No.: US 6,400,623 B2  
(45) Date of Patent: Jun. 4, 2002

(54) SEMICONDUCTOR MEMORY HAVING PARALLEL TEST MODE

(75) Inventor: Kazuki Ohno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/781,054

(22) Filed: Feb. 8, 2001

(30) Foreign Application Priority Data

Feb. 8, 2000 (JP) ......................................... 2000-029913

(51) Int. Cl.[7] ................................................ G11C 7/00
(52) U.S. Cl. ........................ 365/201; 365/205; 365/208; 365/230.03
(58) Field of Search ........................... 365/201, 189.07, 365/205, 207, 208, 230.03

(56) References Cited

U.S. PATENT DOCUMENTS

| | | | | |
|---|---|---|---|---|
| 5,016,220 A | * | 5/1991 | Yamagata | 365/201 |
| 5,060,230 A | * | 10/1991 | Arimoto et al. | 365/201 |
| 5,077,689 A | * | 12/1991 | Ahn | 365/201 |
| 5,185,744 A | * | 2/1993 | Arimoto et al. | 371/21.2 |
| 5,708,614 A | * | 1/1998 | Koshikawa | 365/201 |
| 5,928,373 A | * | 7/1999 | Yoo | 714/719 |

* cited by examiner

*Primary Examiner*—Son Mai  
(74) *Attorney, Agent, or Firm*—Darryl G. Walker

(57) ABSTRACT

A semiconductor memory (200) having a plurality of banks (10 and 20) of memory cells in which a parallel test operation can allow bits from each bank to be tested in parallel. According to one embodiment, the semiconductor memory may include a data amplifier (30) having a selection circuit (110), data sense circuit (120), data output circuit (130), control circuit (140), and comparator (C1). In a normal mode of operation, the selection circuit (110) may be coupled to receive I/O busses (IOAT/N and IOBT/N) from memory banks (10 and 20) and based on selection control signals (TR1 to TR4), may select data to be amplified by data sense circuit (120) and output to a read/write bus RWBST/N. In a test mode of operation, the selection circuit (110) may be coupled to receive I/O busses (IOAT/N and IOBT/N) from memory banks (10 and 20) and may couple data from each memory bank (10 and 20) to a data sense circuit (120) to be amplified and applied to comparator (C1). Comparator (C1) may compare the data in parallel and output a comparison result to read/write bus RWBST/N. In this manner a data amplifier (30) may be shared by a plurality of banks (10 and 20) and also provide parallel test operation.

20 Claims, 3 Drawing Sheets

SEMICONDUCTOR MEMORY HAVING PARALLEL TEST MODE

TECHNICAL FIELD

The present invention relates generally to semiconductor memory devices, and more particularly to semiconductor memory devices having efficient parallel multi-bit testing.

BACKGROUND OF THE INVENTION

A semiconductor memory device can typically be arranged into a plurality of banks, which may be independently operated. Each bank may be arranged into a plurality of memory cell plates or arrays, which contain memory cells arranged in rows and columns. Memory cells are selected based on row and column address values.

In an independently operable bank, a row of memory cells is selected by a low order address (row address), which is input into a row decoder. From the selected row of memory cells, a specific cell or cells are selected by a high order address (column address), which is input into a column decoder. Thus, a bit from a memory cell or a group of memory cells can be selected in order to be read out of a semiconductor memory device.

In the read operation, data selected by the address value is output from a memory cell array by way of a data line or input/output (I/O) bus. This data can then be received by a data amplifier (DAMP) and output to a read/write bus (RWBS). The data is then output from the semiconductor memory device by way of an output amplifier or buffer.

As an example, in a semiconductor memory arranged into four banks and having 16 data input/output pins, 16 read/write busses (RWBS) and 64 (16×4) data amplifiers (DAMP) will typically exist.

An example of a block diagram showing a semiconductor memory configured with two banks can be seen in FIG. 3.

The semiconductor memory of FIG. 3 contains two independently operable banks (10 and 20) shown as BANK A and BANK B. Each bank (10 and 20) is connected to a data amplifier DAMP 40 by way of an I/O bus (IOAT/N and IOBT/N). Each bank (10 and 20) includes its own DAMP 40. This allows increased operating speed of the semiconductor memory by reducing the length of the I/O bus from the memory cell array to the DAMP. Read/write bus RWBST/N receives the output of the DAMP 40. Typically, there may be only one read/write bus RWBST/N per data pin on a chip. Thus in the case of 16 external data pins (×16) there may be only 16 read/write busses RWBST/N. Read/write bus RWBST/N and I/O buses (IOAT/N and IOBT/N) contain both a "true" and a "not true" line, which carry data and complementary data.

In a normal read operation only one DAMP 40 is enabled per read/write bus RWBST/N. This is based on a data amplifier enable signal DAE, which will be activated in accordance with the activated bank (10 or 20). Thus, it can be seen that BANK A 10 and BANK B 20 can share the same read/write bus RWBST/N on which data may be read out of either bank (10 or 20).

However, in order to decrease test time in a production part, parallel test schemes are implemented that allow multiple bits to be read in parallel, compared with each other and the result of the comparison being output on a data pin. This will allow for instance a ×16 device to have 32 bits being tested in one read cycle which will increase the test throughput, thus reducing test time and therefore reducing manufacturing costs.

In the configuration of FIG. 3, a parallel test mode can be implemented by activating both banks (10 and 20) and allowing both DAMPs 40 to be activated and operate as a wired-OR/NOR with read/write bus RWBST/N being the output. This can be accomplished by precharging the complementary data line of read/write bus RWBST/N to a high logic/voltage level and having each DAMP 40 pull down (apply a low logic/voltage level) either the "T" or "N" depending on whether the data received from the bank (10 and 20) was a zero or one logic value. In the parallel test mode, the same data logic value is output from each bank (10 and 20) indicating a "pass"=0 condition in which only one data line from the read/write bus RWBST/N is pulled down. However, if BANK A 10 outputs a different data logic value than BANK B 20, one DAMP 40 will pull down one of the data lines from the read/write bus RWBST/N and the other DAMP 40 will pull down the other data line from the read/write bus, thus indicating a "fail" condition. The "pass" or "fail" condition can then be detected by detection circuitry (not shown).

Referring to FIG. 4, a circuit schematic diagram of the conventional data amplifier DAMP 40 is set forth. The conventional data amplifier DAMP 40 can be used in the semiconductor memory of FIG. 3.

The conventional data amplifier 40 includes differential amplifiers (D1–D3), inverters (L20 and L21), 2-input NOR gates (L22 and L23), and pull down n-channel insulated gate field effect transistors (IGFETs) (N5 and N6). The top conventional data amplifier 40 illustrated in FIG. 4, corresponds to DAMP 40 connected to BANK A 10 in FIG. 3. FIG. 4 also includes the bottom conventional data amplifier 40 drawn as a box with only pull down IGFETs (N7 and N8) illustrated, however, it is understood that the bottom conventional data amplifier 40 includes the same elements as the top conventional data amplifier 40. The bottom conventional data amplifier 40 corresponds to DAMP 40 connected to BANK B 20 in FIG. 3.

The top conventional data amplifier 40 receives data I/O line IOAT and complementary data I/O line IOAN from BANK A 10 as inputs. Top conventional data amplifier 40 also receives data amplifier enable signal DAEA as an input and has outputs connected to read/write bus RWBST/N.

The operation of conventional data amplifier 40 will be explained with reference to the conventional data amplifier connected to BANK A 10. When data amplifier enable signal DAEA is at a low logic level, top conventional data amplifier 40 of FIG. 4 is disabled. The low logic level of data amplifier enable signal DAEA is applied to differential amplifiers (D1–D3) thus placing the differential amplifiers (D1–D3) in a disable state. The low logic level of data amplifier enable signal DAEA propagates through inverter L20 and 2-input NOR gates (L22 and L23) to force the gates of n-channel IGFETs (N5 and N6) to a logic low level, thus placing n-channel IGFETs (N5 and N6) in a non-conducting state.

When data amplifier enable signal DAEA is at a high logic level differential amplifiers (D1 to D3) are enabled. Differential amplifier D1 receives data line IOAT at a positive input terminal and complementary data line IOAN at a negative input terminal while differential amplifier D2 receives data line IOAT at a negative input terminal and complementary data line IOAN at a positive input terminal. The outputs of differential amplifier D1 and differential amplifier D2 are then applied to the positive and negative input terminals of differential amplifier D3 respectively. In this manner, by applying I/O bus IOAT/N to differential amplifiers (D1 and D2) in a complementary fashion, variations in the process or layout of the differential amplifiers (D1 and D2) that may cause an imbalance can be cancelled. The output of differential amplifier D3 is then applied to the gate of n-channel IGFET N5 by way of 2-input NOR gate L22. The output of differential amplifier D3 is also applied to the gate of n-channel IGFET N6 by way of inverter L21 and 2-input NOR gate L22. In this manner, if I/O bus IOAT/N carries logical one data, the gate of n-channel IGFET N5 will remain low and the gate of n-channel IGFET N6 will become high, thus discharging read/write bus line RWBSN. However, if I/O bus IOAT/N carries logical zero data, the gate of n-channel IGFET N6 will remain low and the gate of n-channel IGFET N5 will become high, thus discharging read/write bus line RWBST.

It is understood that the bottom conventional data amplifier 40 operates in the same manner as the top conventional data amplifier 40 except the bottom conventional data amplifier 40 has inputs corresponding to BANK B 20 instead of BANK A 10.

The minimum number of data amplifiers 40 required corresponds to the number of data output pins on the chip. However, as mentioned, in order to improve speed the semiconductor memory of FIG. 3 includes a data amplifier 40 per pin in every bank. This also will allow a parallel test mode in which more than one data bit can be tested per data output pin in one read operation, thus allowing a reduction test time and reducing manufacturing costs.

However, when data amplifiers 40 are arranged in every bank, die or chip size is increased, thus increasing manufacturing costs because fewer chips can be printed on a single wafer.

Thus, there are two conflicting parameters, one is the desire to increase the number of bits that can be tested in one cycle in order to increase test throughput. The other is the desire to have a small chip size. If a single data amplifier is used per data output pin (a data amplifier is shared among different banks), then the chip size is reduced. However, then the number of bits that can be tested in one cycle is limited to a bit per data output pin. Alternatively, if more data amplifiers are placed on the chip, for example, one per bank per data output pin, then a parallel test can improve test throughput, but chip size is increased.

In view of the above discussion, it would be desirable to provide a semiconductor memory in which a data amplifier can process more than one bit of data when in a parallel test mode thereby allowing high test throughput without greatly increasing chip size.

SUMMARY OF THE INVENTION

According to the present embodiments, a semiconductor memory device includes a normal read mode and a parallel test mode of operation. The semiconductor memory device includes a plurality of banks coupled to a data amplifier. In the normal mode of operation the data amplifier selects data from one of the banks and outputs it to a read/write bus. In the parallel test mode, the data amplifier compares data from a plurality of the banks and outputs a comparison result.

According to one aspect of the embodiments, the data amplifier includes a selection circuit that selects data from one memory bank in a normal mode of operation and selects data from a plurality of banks in a parallel test mode of operation. The selection circuit can include selection gates that select data according to a selection control signal or a bank address.

According to another aspect of the embodiments, the selection circuit can include a multiplexer that can select data according to a bank address.

According to another aspect of the embodiments, the data amplifier can include a data sense circuit that can amplify one bit of selected data in a normal mode of operation and can amplify a plurality of selected data bits in a parallel test mode of operation.

According to another aspect of the embodiments, the data sense circuit can include a plurality of amplifier circuits such as differential amplifiers that may be configured in a cascaded manner to amplify one bit of selected data in a normal mode of operation and configured to operate individually to amplify a plurality of selected data bits in a parallel test mode of operation.

According to another aspect of the embodiments, the data sense circuit can include a configuration circuit that in response to a test signal can configure a plurality of amplifier circuits to operate individually to amplify a plurality of data bits or in a cascaded manner to amplify a single data bit.

According to another aspect of the embodiments, the data amplifier may include a data output circuit that outputs selected data to a read/write bus in a normal mode of operation. The data amplifier may be disabled in the parallel test mode of operation.

According to another aspect of the embodiments, the data amplifier may include a comparator that compares the plurality of data bits outputted from the data sense circuit in the parallel test mode of operation and generates a comparison result on a read/write bus. The data amplifier may include pull down n-channel transistors operating in a wired NOR configuration with pull down n-channel transistors that may be included in the data output circuit.

According to another aspect of the invention, the comparator may operate to discharge a read/write bus when there is a comparison fail result and may output data when there is a comparison pass result.

According to another aspect of the invention, the comparator may operate to output a logic one when there is a comparison pass result and output a logic zero when there is a comparison fail result.

According to another aspect of the invention, the data amplifier may include a control circuit that receives a parallel test mode signal and a data amplifier enable signal. The control circuit can generate an amplifier enable signal to be received by a data sense circuit. The control circuit can further generate a data output circuit enable signal to be received by a data output circuit. The control circuit can generate a comparator enable signal to be received by a comparator circuit. The control circuit can include a delay element for delaying the generation of the comparator enable signal.

DETAILED DESCRIPTION OF THE EMBODIMENTS

Various embodiments of the present invention will now be described to in detail with reference to a number of drawings.

Figure 2:
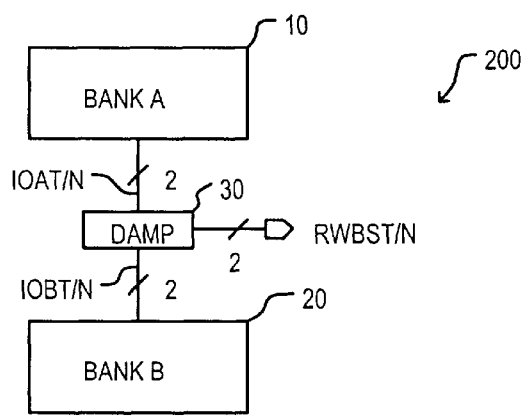
FIG. 2 is a block schematic diagram of a semiconductor memory according to an embodiment.

Referring now to FIG. 2, a semiconductor memory according to a first embodiment is set forth and given the general reference character 200. The semiconductor memory 200 may include two independently operable banks (10 and 20) shown as BANK A and BANK B. Unlike the conventional approach shown in FIG. 3, the semiconductor memory 200 of FIG. 2 shares a data amplifier 30 between both banks (10 and 20). Although only two banks (10 and 20) are shown, it is understood that generally more than two banks (for example, 2, 4, . . . ) can exist in the semiconductor memory 200.

Each bank (10 or 20) may be arranged into a plurality of memory cell plates or arrays, which contain memory cells arranged in rows and columns. Memory cells can be selected based on row and column address values. Each bank may include memory cells, sense amplifiers, row and column decoders which are generally well known and thus omitted from the detailed description.

In the semiconductor memory 200 of FIG. 2, BANK A 10 and BANK B 20 may be coupled to data amplifier DAMP 30 through I/O busses IOAT/N and IOBT/N respectively. I/O busses IOAT/N and IOBT/N are used to transfer data to and from BANK A 10 and BANK B 20 respectively. Although it is not shown, I/O busses IOAT/N and IOBT/N may be coupled to a write amplifier, however, the write amplifier is not necessary for a detailed description of the invention, thus can be omitted from the drawings.

A data amplifier DAMP 30 and a write amplifier (not shown) can be coupled to a read/write bus RWBST/N. Read/write bus RWBST/N may be coupled to an input/output (I/O) buffer which applies data to a data I/O pin in a read operation and receives data from a data I/O pin in a write operation. The data I/O pin is external to the chip.

Figure 3:
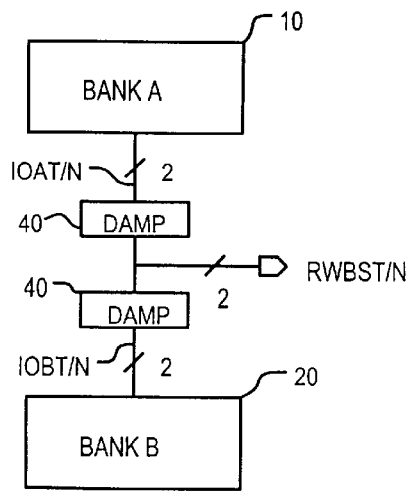
FIG. 3 is a block schematic diagram of a conventional semiconductor memory.
Figure 4:
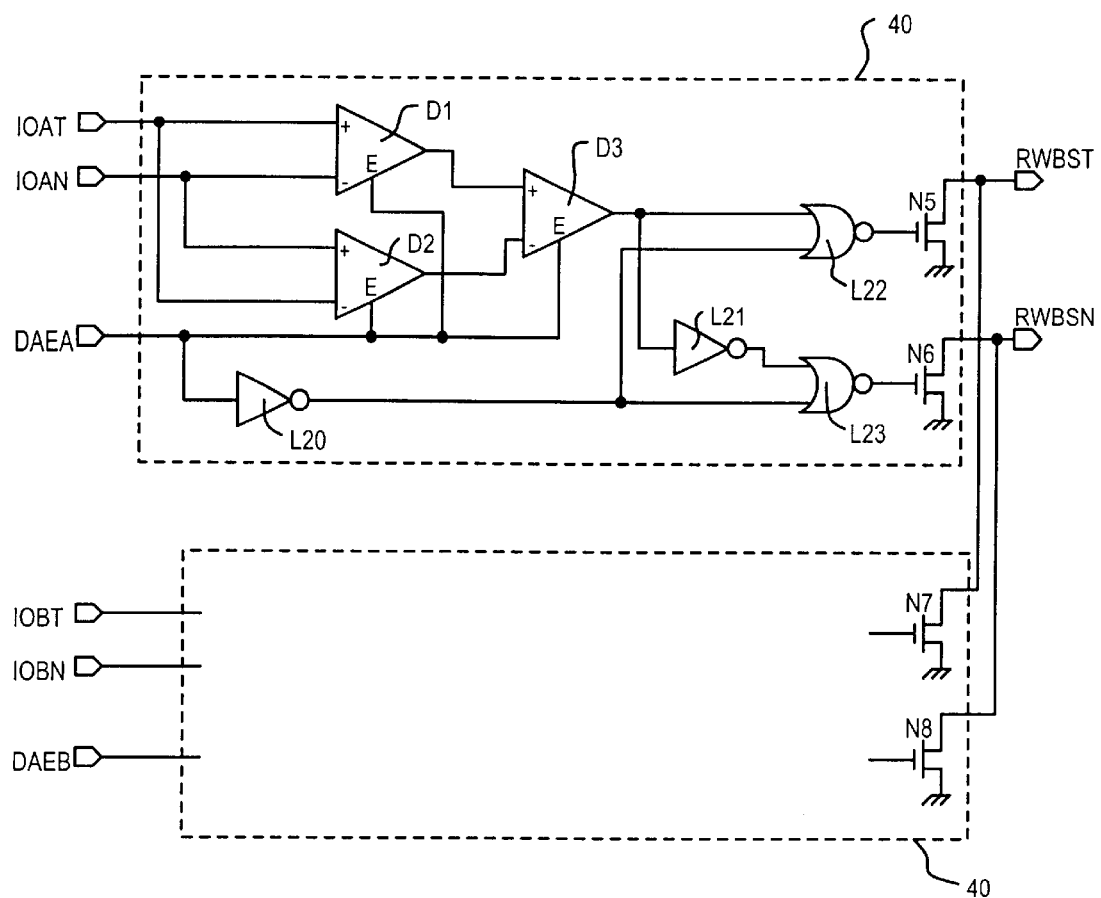
FIGS. 4 is circuit diagram of a conventional data amplifier.

As noted, unlike the conventional approach shown in FIG. 3, the semiconductor memory 200 of FIG. 2 shares a data amplifier 30 between both banks (10 and 20).

Figure 1:
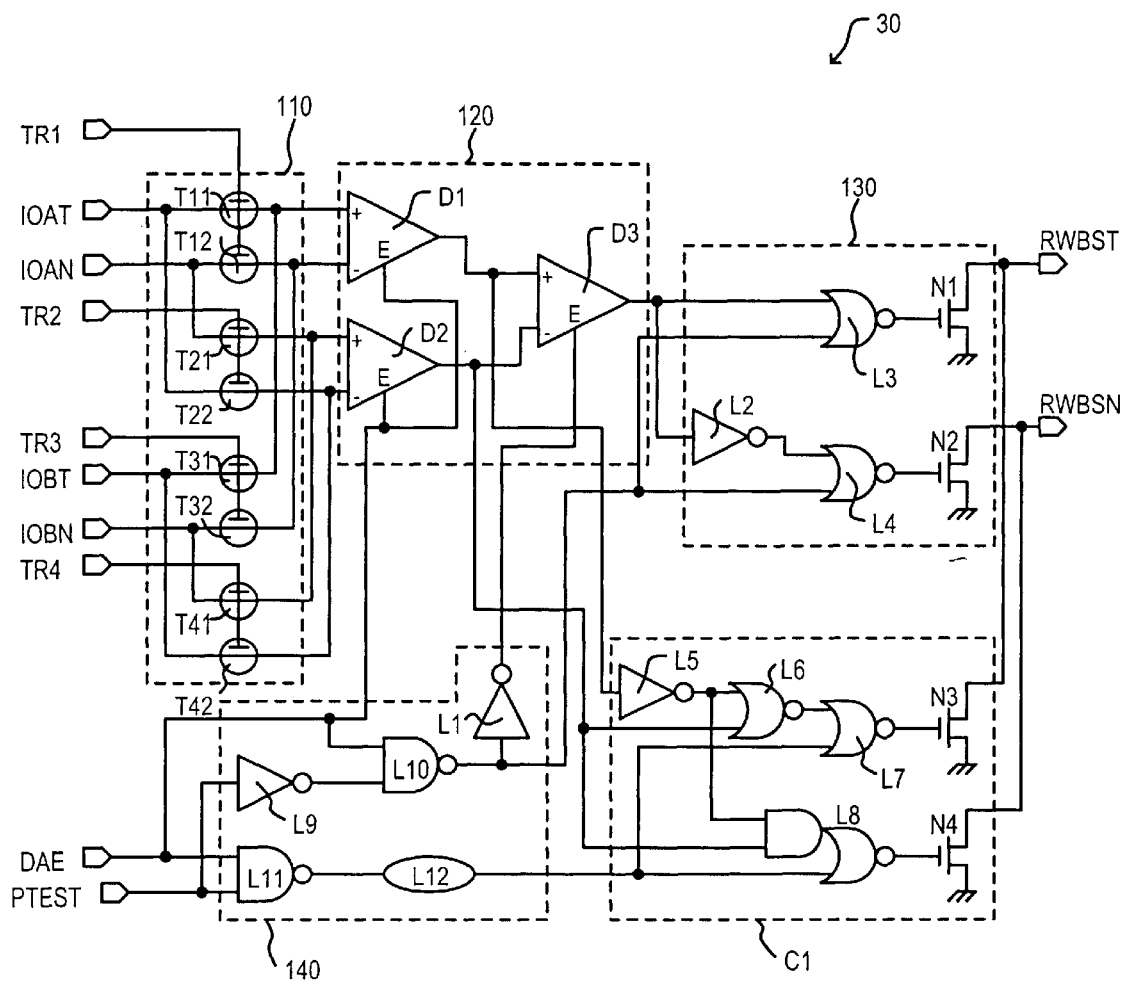
FIG. 1 is a circuit diagram of a data amplifier according to a first embodiment.

Referring now to FIG. 1, a circuit diagram of a data amplifier 30 according to one embodiment is set forth. Data amplifier 30 may include a selection circuit 110, a data sense circuit 120, data output circuit 130, control circuit 140 and comparator C1.

Selection circuit 110 may be coupled to receive data on I/O bus IOAT/N from BANK A 10 and data on I/O bus IOBT/N from BANK B 20. Selection circuit 110 may also be coupled to receive selection control signals (TR1–TR4). Selection circuit 110 may provide outputs to data sense circuit 120. Selection control signals (TR1–TR4) may determine which I/O bus (IOAT/N and/or IOBT/N) data is passed to data sense circuit 120. Selection circuit 110 may include four selection gates (T11–12 to T41–42). Selection gates (T11–12 to T41–42) may be coupled to receive selection control signals (TR1–TR4), respectively. A selection gate (T11–12 to T41–42) can provide a low impedance path between an I/O bus (IOAT /N or IOBT /N) and a data sense circuit 120 when its selection control signal (TR1–TR4) is in the select state and may provide a high impedance path between an I/O bus (IOAT/N or IOBT/N) and a data sense circuit 120 when its selection control signal (TR1–TR4) is in the unselect state.

Data sense circuit 120 can be coupled to receive outputs from selection circuit 110 and a data amplifier enable signal DAE. Data sense circuit 120 may also be coupled to receive an output from control circuit 140. Data sense circuit 120 can provide outputs to data output circuit 130 and comparator C1. Data sense circuit 120 may include differential amplifiers (D1–D3). Differential amplifiers (D1 and D2) can receive data amplifier enable signal as an enable signal. Differential amplifiers (D1 and D2) can receive outputs from selection circuit 110 and can provide outputs for comparator C1 and differential amplifier D3. Differential amplifier D3 can receive an output from control circuit 140 as an enable signal. Differential amplifier D3 can provide an output for data output circuit 130.

Data output circuit 130 can receive an output from control circuit 140 as a data output enable signal. Data output circuit 130 can also receive an output from data sense circuit 120. Data output circuit 130 can provide outputs to read write bus RWBST/N. Data output circuit 130 can include inverter L2, 2-input NOR gates (L3 and L4), and pull down n-channel IGFETs (N1 and N2).

Control circuit 140 can receive a data amplifier enable signal DAE and a parallel test enable signal PTEST, and can provide control outputs to data sense circuit 120, data output circuit 130, and comparator C1. Control circuit may include inverters (L1 and L9), 2-input NAND gates (L10 and L11) and delay element L12.

Comparator C1 can receive a control output from control circuit 140 and outputs from data sense circuit 120 and can provide a data comparison result to read/write bus RWBST/N. Comparator C1 can include an inverter L5, 2-input NOR gates (L6 and L7), complex logic gate (AND-NOR) L8, and pull down n-channel IGFETs (N3 and N4).

The operation of data amplifier 30 illustrated in FIG. 1 will now be explained.

In a standby or precharge operation, data amplifier enable signal DAE is at a low logic level and data amplifier 30 can be disabled. The low logic level can be received at an enable input of differential amplifiers (D1 and D2) which can place them in a disable state. Also, the low logic level of DAE can be received by NAND gate L10, thus producing a high output which can farther be inverted by inverter L1. Thus, a low logic level may be provided to an enable input of differential amplifier D3, which can place it in a disable state. The high logic output of NAND gate L10 can be provided as inputs to NOR gates (L3 and L4), which may force the gates of n-channel IGFETs (N1 and N2) low, thus disabling the data output circuit 130. The low logic level of DAE may also be received by NAND gate L11, thus producing a high output. This high output can be provided to NOR gates (L7 and L8) through delay element L12. Thus, gates of n-channel IGFETs (N3 and N4) may be forced low, disabling the comparator C1.

In a normal data read mode of operation of the semiconductor memory having a plurality of banks, parallel test signal PTEST can be at a low level. A bank (10 or 20) may be activated and can produce data onto an I/O bus (IOAT/N or IOBT/N). In a normal mode of operation only one of the banks (10 or 20) may be read from or written to at one time.

As an example, assuming in the normal read mode of operation data is being read from BANK A 10. Data may be produced from BANK A 10 onto I/O bus IOAT/N. Selection control signal TR1 can be in an active state (logic high), thus selection gate T11–T12 can pass the data on I/O bus IOAT/N to the positive and negative input terminals respectively of differential amplifier D1. At the same time, selection control signal TR2 can be in an active state, thus selection gate T21–T22 can pass the data on I/O bus IOAT/N to the negative and positive input terminals respectively of differential amplifier D2.

Shortly after the data has been applied to the input terminals of differential amplifiers (D1 and D2), thus achieving a sufficient voltage differential for sensing to occur, data amplifier enable signal DAE can become active (logic high). When DAE becomes active differential amplifiers (D1 and D2) can become active and may drive sensed data outputs onto the positive and negative input terminals of differential amplifier D3. Differential amplifiers (D1 and D2) can also drive sensed data outputs to comparator C1, however, because parallel test signal PTEST is in a disable state (logic low), a logic high level can driven onto the input of NOR L7 and NOR input of complex logic gate L8. Thus, comparator C1 can be disabled by forcing the control gates of n-channel IGFETs (N3 and N4) low. The low logic level of PTEST can be used to enable NAND gate L10 by way of inverter L9. Because NAND gate L10 is enabled, when DAE becomes active, differential amplifier D3 can be enabled after DAE propagates through NAND L10 and inverter L1. Thus, differential amplifier D3 may produce an output signal indicative of the data logic level on I/O bus IOAT/N to data output circuit 130. Because DAE is at a high logic level and PTEST is at a low logic level, NAND L10 can provide a low logic level to input of NOR gates (L3 and L4), thus placing them in an enable state. Thus, if data sense circuit 120 receives a logical one on I/O bus IOAT/N, data sense circuit 120 can provide a logical high output to NOR L3 which can produce a logical zero (low voltage level) to the gate of n-channel IGFET N1. The logical high output can also be applied to inverter L2 which produces a logical low output which can be received by NOR L4. NOR L4, in turn, can produce a logical high (high voltage level) to the gate of n-channel IGFET N2. Thus, read write bus line RWBSN can be discharged from the precharged high level toward a VSS or ground level through n-channel IGFET N2. Alternatively, if data sense circuit 120 receives a logical zero on I/O bus IOAT/N, data sense circuit 120 can provide a logical low output to NOR L3 which can produce a logical high (high voltage level) to the gate of n-channel IGFET N1. The logical low output can also be applied to inverter L2 which produces a logical high output which can be received by NOR L4 which can produce a logical low (low voltage level) to the gate of n-channel IGFET N2. Thus, read/write bus line RWBST can be discharged from the precharged high level toward a VSS or ground level through n-channel IGFET N1.

When reading data from BANK B 20 data amplifier 30 can operate generally in the same manner as when reading data from BANK A 10 except selection control signals (TR3 and TR4) may be activated, while selection control signals (TR1 and TR2) may be disabled.

Thus, when reading data from BANK A 10, selection control signals (TR1 and TR2) may be activated, while selection control signals (TR3 and TR4) may be disabled. However, when reading data from BANK B 20, selection control signals (TR3 and TR4) may be activated, while selection control signals (TR1 and TR2) may be disabled. In a normal read operation, selection control signals can be seen as a bank address, with selection control signals (TR1 and TR2) corresponding to a BANK A address and selection control signals (TR3 and TR4) corresponding to a BANK B address.

Now, the operation of data amplifier 30 will be explained when semiconductor memory 200 operates in a parallel test mode.

Referring once again to FIG. 1, in a parallel test mode of operation parallel test signal PTEST can be at a logic high level and selection control signals (TR1 and TR4) can be enabled and selection control signals (TR2 and TR3) can be disabled. With PTEST at a logic high level, differential amplifier D3 can be disabled by control circuit 140 by way of inverter L9, NAND gate L10 and inverter L1, with inverter L1 applying a logic low level to the enable input of differential amplifier D3. Also, data output circuit 130 can be disabled by way of inverter L9 and NAND gate L10, with NAND gate L10 applying a logic high to an input of NOR gates (L3 and L4).

In a parallel test mode, data in BANK A 10 and BANK B 20, as selected by a row and column address, can be respectively applied to I/O buses (IOAT/N and IOBT/N). Data from BANK A 10 can be applied to differential amplifier D1 through selection gates T11–T12. Data from BANK B 20 can be applied to differential amplifier D2 through selection gates T41–T42. Data amplifier enable signal DAE can then be activated to a logic high level and thus activate differential amplifiers (D1 and D2). Differential amplifiers (D1 and D2) can amplify the received data and can apply it as inputs to comparator C1. Because PTEST is at a logic high level, comparator C1 can then be enabled by DAE by way of NAND gate L11 and delay element L12. Delay element L12 can help to ensure that differential amplifiers (D1 and D2) have amplified the data from I/O busses (IOAT/N and IOBT/N) to a sufficient potential level so as to be correctly evaluated by comparator C1. Delay element L12 may be, but is not limited to, a single edge delay element (in this example a negative edge delay) to ensure a delayed enable of comparator C1, but a quick disable of comparator C1.

It is noted that in the parallel test mode, data from BANK A 10 can be input to differential amplifier D1 in a non-inverting manner, but data from BANK B 20 can be input to differential amplifier D2 in an inverting manner. Thus, when data read from the banks (10 and 20) matches (is the same logic level) then differential amplifiers (D1 and D2) will have outputs of opposite logic levels with respect to one another. For example, when I/O bus IOAT/N carries data with a high logic level, differential amplifier D1 can produce an output with a high logic level and vice-versa. However, when I/O bus IOBT/N carries data with a high logic level, differential amplifier D2 can produce an output with a low logic level and vice-versa.

In a case in which data on I/O buses (IOAT/N and IOBT/N) do not match, the outputs of differential amplifiers (D1 and D2) are at the same logic level. This assures that at least one input to NOR L6 can be a logic one, thus the output of NOR L6 can be a logic low forcing the gate of n-channel IGFET N3 high. Also, at least one input to AND portion of complex logic gate L8 can be a logic low, thus the output of complex logic gate L8 can force the gate of n-channel IGFET N4 high. With the gates of n-channel IGFETs (N3 and N4) both high, both read/write data lines of read/write bus RWBST/N are pulled to a low logic level (VSS).

In the case in which both I/O busses (IOAT/N and IOBT/N carry logic ones, the output of differential amplifier D1 can be a logic high and the output of differential amplifier D2 can be a logic low. Thus, both inputs to NOR L6 can be logic low producing a logic high output. This logic high output applied to an input of NOR L7 forces the gate of N-channel IGFET N3 to a logic low level. Also, both inputs to AND portion of complex logic gate L8 can be logic lows, this forces the gate of N-channel IGFET N4 to a logic high level. With the gate of N-channel IGFET N3 at a logic low level and the gate of n-channel IGFET N4 at a logic high level, read/write data line RWBST remains at the precharged high level and read/write data line RWBSN is pulled to a logic low level. This indicates a match condition of data value one.

In the case in which both I/O busses (IOAT/N and IOBT/N carry logic zeroes, the output of differential amplifier D1 can be a logic low and the output of differential amplifier D2 can be a logic high. Thus, both inputs to NOR L6 can be logic high producing a logic low output. This logic low output applied to an input of NOR L7 forces the gate of N-channel IGFET N3 to a logic high level. Also, both inputs to AND portion of complex logic gate L8 can be logic highs, this forces the gate of N-channel IGFET N4 to a logic low level. With the gate of N-channel IGFET N3 at a logic high level and the gate of n-channel IGFET N4 at a logic low level, read/write data line RWBSN remains at the precharged high level and read/write data line RWBST is pulled to a logic low level. This indicates a match condition of data value zero.

Summarizing, comparator C1 can apply the true data value to read/write bus RWBSN/T when the data read from the banks (10 and 20) matches. For example, if both data values are logic lows or zeros, then there is a match and comparator C1 pulls down read/write data line RWBST, thus indicating a match where both bits are zeroes. If both data values are logic highs or ones, then there is a match and comparator C1 pulls down read/write data line RWBSN, thus indicating a match where both bits are ones. In the case of not matching data, the data value from one bank (10 or 20) is a logic zero and the data value from the other bank (10 or 20) is a logic one. In this error or non-coincidence case, both read/write data lines from read/write data bus RWBST/N are pulled to a logic low or ground (VSS) level.

Table I sets forth the relationship among data output from banks (10 and 20) and read/write bus RWBST/N when the semiconductor memory operates in the parallel test mode.

TABLE I

| IOAT/N | IOBT/N | Gate of IGFET N3 | Gate of IGFET N4 | RWBST | RWBSN |
|--------|--------|------------------|------------------|-------|-------|
| Low    | Low    | High             | Low              | Low   | High  |
| Low    | High   | High             | High             | Low   | Low   |
| High   | Low    | High             | High             | Low   | Low   |
| High   | High   | Low              | High             | High  | Low   |

As noted, in a conventional type semiconductor memory, a data amplifier can be provided for every bank. This allows parallel test operations, but can have the adverse affect of increasing chip size. In order to decrease chip size a data amplifier may be shared, however, this can limit parallel test capabilities.

With the embodiment disclosed a data amplifier 30 can be shared by a plurality of banks yet still allow a parallel/multibit test operation. It is noted that the embodiment of FIG. 1 can configure the differential amplifiers (D1–D3) differently in the parallel test mode than in the conventional read mode of operation, thus the parallel test mode may be implemented without additional differential amplifiers (D1–D3). More particularly, in a conventional read mode, differential amplifiers (D1–D3) can be used together, and arranged in a cascaded manner in order to amplify a single bit of data received. However, in the parallel test mode, differential amplifiers (D1 and D2) can be used to individually amplify the separate pieces of data to be tested in parallel.

Figure 5:
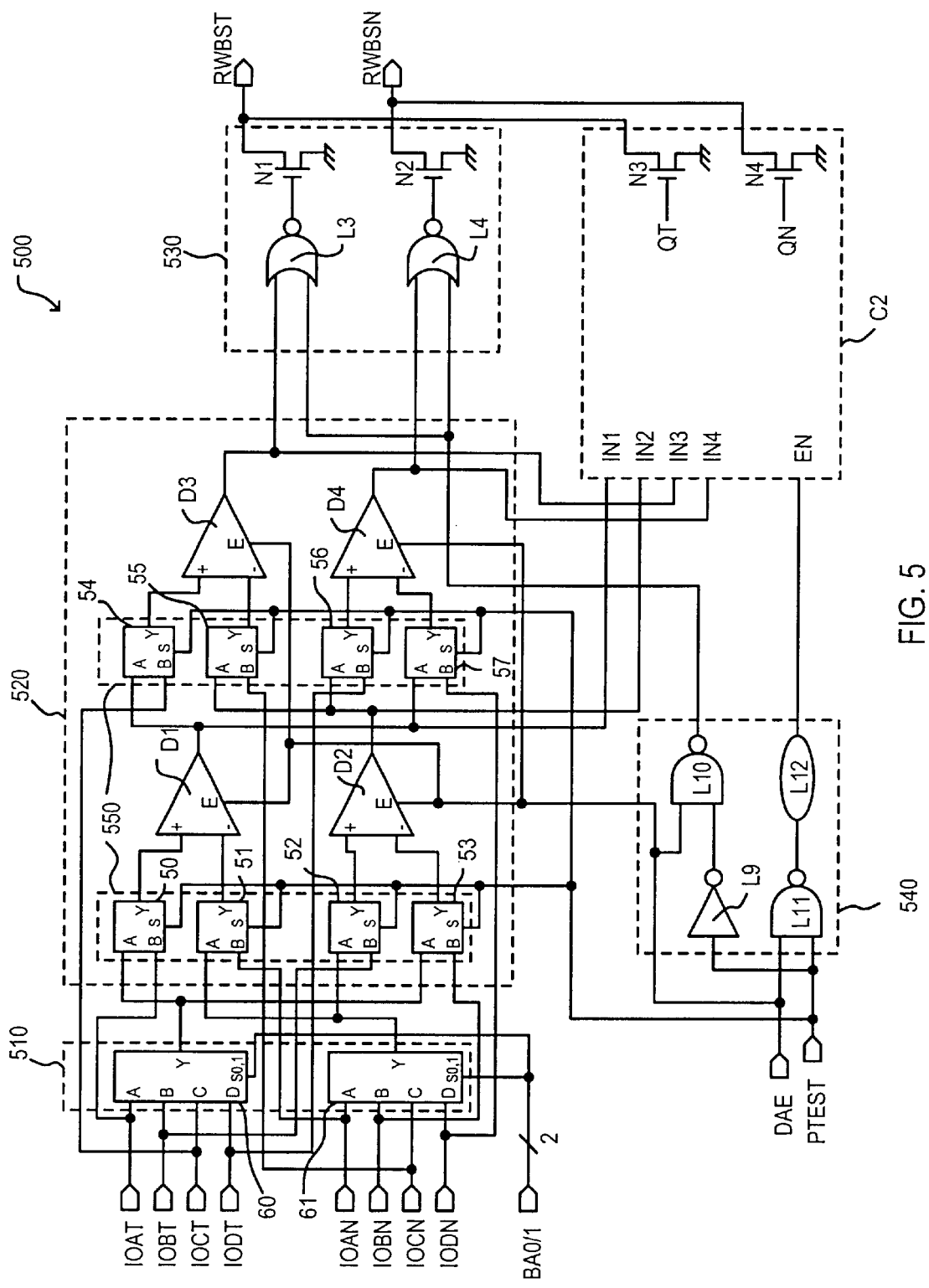
FIG. 5 is a circuit diagram of a data amplifier according to a second embodiment.

Referring now to FIG. 5, a circuit diagram of a data amplifier according to an embodiment that can be shared by four banks is set forth and given the general reference character 500. Data amplifier 500 may include a selection circuit 510, a data sense circuit 520, data output circuit 530, control circuit 540 and comparator C2.

Selection circuit 510 may include selection gates (60 and 61). Each selection gate (60 and 61) can be a four-to-one selector or multiplexer. Selection gate 60 can pass an I/O bus line (IOAT-IODT) through based on the value of a 2-bit bank address BA0/1. Selection gate 61 can pass an I/O bus line (IOAN-IODN) through based on the value of a 2-bit bank address BA0/1. In this manner, in a normal read mode, one bank (BANK A-D) can have its I/O bus (IOAT/N-IODT/N) coupled to data sense circuit 520.

Data sense circuit 520 may include four differential amplifiers (D1 to D4) and a test configuration circuit 550. In a normal data read mode, test configuration circuit 550 can pass data from selection circuit 520 to differential amplifiers (D1 and D2). Also, in a normal data read mode, test configuration circuit 550 can configure the differential amplifiers (D1 to D4) so that they may operate in a cascaded type configuration. Differential amplifier D1 can be configured to receive data from a selected I/O bus (IOAT/N-IODT/N) in a non-inverted fashion. Differential amplifier D2 can be configured to receive data from a selected I/O bus (IOAT/N-IODT/N) in an inverted fashion. Differential amplifier D3 can be considered to be cascaded with differential amplifiers (D1 and D2) to receive their outputs such that it amplifies the non-inverted data. Differential amplifier D4 can be considered to be cascaded with differential amplifiers (D1 and D2) to receive their outputs such that it amplifies the inverted data. Thus, in a normal read mode, data sense circuit 520 can produce non-inverted and inverted data to data output circuit 530.

In a parallel test mode, test configuration circuit 550 can configure differential amplifiers (D1 to D4) so that they can operate to individually receive and amplify data from each of the I/O busses (IOAT/N to IODT/N). This data can then be applied to comparator C2. In this manner, data from all four banks can be received and amplified for a four-bit parallel test comparison.

The test configuration circuit 550 can include selection gates (50 to 57). Selection gates can be two-to-one selectors or multiplexers that receive a parallel test signal PTEST as a selection control signal. When in a normal mode, PTEST is low and selection gates (50 to 57) can pass the "A" input to the output "Y". In this manner, an I/O bus (IOAT/N-IODT/N) which can be selected by selection circuit 510 can be passed to differential amplifiers (D1 and D2) and differential amplifiers (D1 to D4) can be configured in a cascaded configuration. However, in a parallel test mode, PTEST is high and selection gates (50 to 57) can pass the "B" input to the output "Y". In this manner, each differential amplifier (D1 to D4) can be configured to receive an input from a separate I/O bus (IOAT/N to IODT/N). More particularly, differential amplifier D1 may receive data from IOAT/N. Differential amplifier D2 may receive data from IOBT/N. Differential amplifier D3 may receive data from IOCT/N. Differential amplifier D4 may receive data from IODT/N.

Differential amplifiers (D1 to D4) can receive and can be enabled/disabled by data amplifier enable signal DAE.

Data output circuit 530 and control circuit 540 can operate generally in a similar manner as the output circuit 130 and control circuit 140 in the embodiment of FIG. 1.

Comparator C2 can receive the four data bits at input terminals (IN1 to IN4). Comparator C2 can be a four-bit comparison circuit and, when a parallel test mode is enabled, can produce a comparison result (QT and QN) to the gates of n-channel IGFETs (N3 and N4) respectively. If all four data bits input to comparator C2 are at a logic one, RWBST remains high and RWBSN is pulled low, thus indicating a comparison one pass condition. If all four data bits input to comparator C2 are at a logic zero, RWBST is pulled low and RWBSN remains high, thus indicating a comparison zero pass condition. If any of the four data bits input to comparator C2 have different logic levels than any of the others, then both RWBST and RWBSN are pulled low, indicating a comparison fail condition.

Data amplifier 500 can receive data on I/O busses (IOAT/N-IODT/N) from four different banks (BANKS A–D). In a normal read mode, data amplifier 500 can output data on read/write bus RWBST/N from a bank (BANK A, B, C, or D). The I/O bus (IOAT/N-IODT/N), which is to have data output by data amplifier 500, can be selected based on a 2-bit bank address BA0/1. However, in parallel test mode of operation, data amplifier 500 can receive data from all four banks (BANK A, B, C, and D), can compare the data to see if there is a coincidence or match and may output a pass/fail condition accordingly to read/write buss RWBS/N.

It is understood that data can be selected from a bank according to a row and column address value. Also, in a normal read mode, only one bank may be active in a read cycle, however, up to four banks may be active and only one bank may have data read out by data amplifier 500 at a given time.

It is noted that in the embodiment of FIG. 5, only four differential amplifiers can be used to read data or perform a parallel test on data from four different banks. In the embodiment of FIG. 1, six differential amplifiers may be needed. Thus, the four differential amplifiers may not be seen as an increase in chip size, but may be seen as an overall reduction in chip size.

In the embodiments of FIG. 1 and FIG. 5, when there is a parallel test operation with a data match condition, the actual data is output indicating a match. For example, a logic high is output to indicate a match of data ones, and a logic low is output indicating a match of data zeroes. This can be used in an expected data type parallel test in order to compare whether the match correlates with the expected data (one or zero) that was written to the semiconductor memory.

However, another embodiment can be used. For example, when a data comparison indicates a fail, data amplifier (30 or 500) can output a zero value. When data comparison indicates a pass condition, data amplifier (30 or 500) can output a one value.

Table II shows the logic levels for the above in the case of data amplifier 30 of FIG. 1.

TABLE II

| IOAT/N | IOBT/N | Gate of IGFET N3 | Gate of IGFET N4 | RWBST | RWBSN |
|---|---|---|---|---|---|
| Low | Low | Low | High | High | Low |
| Low | High | High | Low | Low | High |
| High | Low | High | Low | Low | High |
| High | High | Low | High | High | Low |

Comparator 500 in the embodiment of FIG. 5, can also be modified to give similar outputs as shown in TABLE II for a four-bit parallel test comparison.

In the embodiments disclosed in FIGS. 1 and 5, read/write bus RWBST/N may be precharged high and unwanted glitches may erroneously discharge a bus line in read/write bus RWBST/N. Thus, it can be noted with reference to the embodiment of FIGS. 1 and 5, timings of the enabling of data sense circuits (120 and 520), data output circuits (130 and 530), and comparators (C1 and C2) may be adjusted to eliminate erroneous glitches on the gates of n-channel pull down IGFETS (N1 to N4).

It is understood that the embodiments described above are exemplary and the present invention should not be limited to those embodiments. For example, although parallel test examples have been given for 2-bit and 4-bit parallel test. The parallel test circuitry can be designed to test any plurality of bits in parallel. The parallel test mode may be entered by using a "key" address in combination with a test entry mode cycle or by using a test voltage applied to an external pin or bond pad, to name just a few examples.

Delay circuits L12 may include capacitive elements, resistive elements, and/or long channel type transistors in order to generate a propagation delay, to name just a few examples.

Although data amplifier (30 and 500) has been described with respect to a precharge/discharge type output (N1 to N4), it is understood that a pull-up transistor (such as a p-type IGFET) can be used. Also, comparator (C1 and C2) can share driver transistors by replacing n-channel IGFETs (N1 to N4) with two n-channel transistors and tri-stating the outputs of logic gates (L3 and L4) when in a parallel test mode or by tri-stating the outputs of logic gates (L7 and L8) when in a normal mode of operation.

Differential amplifiers (D1 to D4) may be current mirror type differential amplifiers or latching sense-amp type differential amplifiers, and can include reference levels for data signal logic references, to name just a few examples.

As noted, in a conventional type semiconductor memory, a data amplifier can be provided for every bank. This allows parallel test operations, but can have the adverse affect of increasing chip size. In order to decrease chip size a data amplifier may be shared, however, this can limit parallel test capabilities. A parallel testing scheme has been disclosed that can allow multiple banks of memory cells to be tested without the addition of a data amplifier in every bank.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device having a normal read mode and a parallel test mode, comprising:
   a first bank of memory cells providing a first data bit when addressed;
   a second bank of memory cells providing a second data bit when addressed; and
   a data amplifier coupled to receive the first data bit from the first bank and the second data bit from the second bank;
   wherein in the normal read mode the data amplifier provides a data output of the first or second data bit, and in the parallel test mode the data amplifier provides a comparison result output based on a comparison of the first and second data bits.

2. The semiconductor memory device of claim 1, further comprising:
   in the normal read mode, the data amplifier selects the first or second data bit for the data output based on the value of selection control signals.

3. The semiconductor memory device of claim 1, further comprising:
   in the parallel test mode, the data amplifier selects the first and second data bit for the comparison based on the value of selection control signals.

4. The semiconductor memory device of claim 3, further including:
   first and second I/O busses for carrying the first and second data bits; and
   the data amplifier includes a sense circuit coupled to the first and second I/O busses wherein in the normal read mode, the sense circuit amplifies one of the first or second data bits and in the parallel test mode the sense circuit amplifies both the first and second data bits.

5. The semiconductor memory device of claim 4, wherein:
   the data amplifier further includes a comparator that in the parallel test mode compares the logic values of the first and second data bits and provides the comparison result output.

6. The semiconductor memory device of claim 1, further including:
   a read/write bus coupled to receive the data output in the normal read mode and the comparison result output in the parallel test mode.

7. The semiconductor memory device of claim 1, wherein the data amplifier further includes:
   a data output circuit for providing the data output;
   a comparator for providing the comparison result output; and
   a control circuit coupled to receive a data amplifier enable signal and a parallel test signal wherein the control circuit enables the data output circuit in the normal read mode and enables the comparator in the parallel test mode.

8. A semiconductor device including a data amplifier coupled to receive data bits from a plurality of banks of memory cells, the data amplifier comprising:
   a plurality of amplifier circuits wherein the plurality of amplifier circuits are configured to amplify one data bit in a first mode of operation and configured to amplify a plurality of data bits in a second mode of operation.

9. The semiconductor device of claim 8, wherein the plurality of amplifier circuits include a first amplifier circuit and a second amplifier circuit and the first and second amplifier circuits are configured to operate in a cascaded manner to amplify the one data bit when in the first mode of operation.

10. The semiconductor device of claim 9, wherein the first and second amplifier circuits are configured to amplify separate bits of data when in the second mode of operation.

11. The semiconductor device of claim 10, further including:
   a mode signal indicating the first mode of operation when at a first logic level and the second mode of operation when at a second logic level;
   a first I/O bus carrying one of the data bits from one of the plurality of banks of memory cells;
   the first amplifier circuit has a first amplifier output;
   the second amplifier circuit has a second amplifier input;
   the data amplifier includes a configuration circuit, the configuration circuit includes a selection gate having a first selection input coupled to the first I/O bus, a second selection input coupled to the first amplifier output, a selection output coupled to the second amplifier input and a selection control coupled to receive the mode signal wherein the selection gate couples the first I/O bus to the second amplifier input when the mode signal is in the second logic level and couples the first amplifier output to the second amplifier input when the mode signal is in the first logic level.

12. The semiconductor device of claim 10, wherein the data amplifier further includes:
   a comparator coupled to receive the separate bits of data from the first and second amplifier circuits and compare the separate bits of data to generate a comparison output.

13. The semiconductor device of claim 12, wherein:
   the first mode of operation is a normal read mode and the second mode of operation is a parallel test mode.

14. The semiconductor device of claim 8, further including:
   a plurality of I/O buses coupled to the plurality of banks of memory cells; and
   the data amplifier further includes a selection circuit coupled between the plurality of I/O busses and the plurality of amplifier circuits wherein the selection circuit couples data on at least one of the plurality of I/O busses to at least one of plurality of amplifier circuits according to a received bank address.

15. A data amplifier having a first operating mode and a second operating mode, comprising:
   a selection circuit coupled to receive a first data input and second data input and in the first operating mode selects the first data input or the second data input according to at least one selection control signal to provide a first selection output and second selection output and in the second operating mode selects both the first data input and the second data input to provide the first and second selection outputs;
   a data sense amplifier that receives the first and second selection outputs and in the first mode of operation amplifies the first and second selection outputs to provide a data sense amplifier output and in the second mode of operation amplifies the first and second selection outputs to provide a first and second compare output;
   a data output circuit that receives the data sense amplifier output and in the first mode of operation provides a data output; and
   a comparator that receives the first and second compare output and in the second mode of operation provides a compare result output.

16. The data amplifier of claim 15, further including:
   a control circuit receiving a mode signal and a data amplifier enable signal and generating a data sense amplifier enable signal and a comparator enable signal;
   the data sense amplifier coupled to receive the data sense amplifier enable signal; and
   the comparator coupled to receive the comparator enable signal.

17. The data amplifier of claim 16, wherein the control circuit further includes a delay element for delaying the generation of the comparator enable signal.

18. The data amplifier of claim 16, wherein the control circuit generates a data output circuit enable signal and the data output circuit is coupled to receive the data output circuit enable signal.

19. The data amplifier of claim 15, wherein the data amplifier receives the first and second data input from a first and second memory array and the selection control signal corresponds to a memory array address in the first operating mode.

20. The data amplifier of claim 19, wherein the first operating mode is a normal read mode and the second operating mode is a parallel test mode.

* * * * *